United States Patent
Daminski et al.

(10) Patent No.: US 9,509,348 B1
(45) Date of Patent: Nov. 29, 2016

(54) TRANSMITTER EFFICIENCY OPTIMIZATION

(71) Applicant: HARRIS CORPORATION, Melbourne, FL (US)

(72) Inventors: Melissa S. Daminski, Pittsford, NY (US); Cory N. Fitzsimmons, Avon, NY (US)

(73) Assignee: Harris Corporation, Melbourne, FL (US)

( * ) Notice: Subject to any disclaimer, the term of this patent is extended or adjusted under 35 U.S.C. 154(b) by 0 days.

(21) Appl. No.: 15/149,917

(22) Filed: May 9, 2016

(51) Int. Cl.
*H04B 1/40* (2015.01)
*H01Q 11/12* (2006.01)
*H04B 1/04* (2006.01)
*H03H 7/38* (2006.01)
*H03F 1/56* (2006.01)
*H03F 3/189* (2006.01)

(52) U.S. Cl.
CPC .............. *H04B 1/0458* (2013.01); *H03F 1/56* (2013.01); *H03F 3/189* (2013.01); *H03H 7/38* (2013.01)

(58) Field of Classification Search
CPC .... H01Q 9/0442; H01Q 1/52; H01Q 13/103; H04B 1/18; H04B 1/38; H04B 1/40; H04B 1/0458; H04B 1/0404; H04B 17/12; H04B 17/21
USPC .............. 455/67.11, 77, 107, 120, 121, 574; 343/700 R, 820, 822, 850, 860
See application file for complete search history.

(56) References Cited

U.S. PATENT DOCUMENTS

| | | | | |
|---|---|---|---|---|
| 8,131,232 | B2 * | 3/2012 | Muhammad | H04B 1/0458 455/127.2 |
| 8,140,027 | B2 * | 3/2012 | Ozgun | H04B 1/0458 455/125 |
| 8,744,384 | B2 | 6/2014 | Mendolia et al. | |
| 8,774,743 | B2 * | 7/2014 | Ali | H01Q 3/267 455/77 |
| 9,203,500 | B2 * | 12/2015 | Danak | H04B 1/40 |
| 9,438,293 | B2 * | 9/2016 | Slater | H04B 1/3838 |

FOREIGN PATENT DOCUMENTS

| | | |
|---|---|---|
| CN | 101540621 A | 9/2009 |
| EP | 2424119 A1 | 2/2012 |

\* cited by examiner

*Primary Examiner* — Quochien B Vuong
(74) *Attorney, Agent, or Firm* — Fox Rothschild LLP; Robert J. Sacco; Carol E. Thorstad-Forsyth

(57) ABSTRACT

Radio transceiver efficiency is improved by operations involving a calibration mode and an operating mode. The calibration mode includes a first calibration to determine a first optimized tuning control data for a first antenna matching network of a first transmitter when a second transmitter of the portable transceiver system inactive. A second calibration of the first antenna matching network while the second transmitter is active to determine second optimized tuning control data. In operational mode the first optimized tuning control data is used when the second transmitter is not active. The second optimized tuning control data is used when the second transmitter is active.

21 Claims, 4 Drawing Sheets

TRANSMITTER EFFICIENCY OPTIMIZATION

BACKGROUND OF THE INVENTION

Statement of the Technical Field

The inventive arrangements relate to energy efficiency improvements in portable radio equipment and more particularly to improvements in transmitter power efficiency in portable radio equipment.

Description of the Related Art

Conventional portable radio transceivers rely on one or more batteries as a primary source of electric power for operating such equipment. A key design specification for a portable radio transceiver is the length of time that the equipment can operate without requiring the batteries to be replaced or recharged. Accordingly, power consumption by such portable radio equipment is an important factor and must be carefully managed.

During transmit operation a transmitter portion of a portable radio transceiver will usually consume significantly more power than a receiver portion of the transceiver. Actual power consumption will depend on the amount of time spent transmitting and the transmitter power consumption characteristics. The transmitter power consumption characteristics can depend on a variety of factors such as the amplifier technology utilized in a particular implementation. But it is not uncommon for the transmitter to be a primary factor in determining battery longevity in a portable radio transceiver system. Within the transmitter, the greatest source of power consumption usually can be found in the final amplifier stage which increases low level radio frequency (RF) exciter signals to much higher power levels.

A high power RF output of a radio transceiver is coupled to an antenna to facilitate wireless transmission. Maximum power transfer from the final output stage of the transmitter to the antenna occurs when the output impedance of the transmitter is matched to the input impedance of the antenna. But antenna input impedance often varies with frequency and with the particular antenna installation. Accordingly, an exact impedance match to the fixed output impedance of the transmitter is often difficult to maintain. This can result in a relatively high voltage standing wave ratio (VSWR) along the transmission line between the transmitter and the antenna. To address this issue, antenna matching networks are commonly used at the RF interface between the transmitter output and the antenna input. The antenna matching network is adjusted so that the antenna appears to have an impedance which approximately matches the output impedance of the transmitter. The correct impedance adjustment or match at the antenna matching network is commonly determined by measuring the VSWR at the output of the transmitter. An optimal match is commonly understood to be attained when the measured VSWR is approximately to 1:1.

Various methods are used to determine a proper adjustment of an antenna matching network. For example, a sensing mechanism such as a directional coupler can be used to detect the VSWR at an antenna port. The directional coupler can detect forward and reflected signals on a transmission line associated with an antenna feed. The signal from the directional coupler is then interpreted by an electronic circuit to adjust a tuning loop. Other systems detect RF load currents of a power amplifier driver circuit (or the power amplifier itself) for purposes of facilitating antenna tuning functions. An exemplary system utilizing such an approach is described in U.S. Pat. No. 8,131,232. Amplifier load currents can indicate how efficient the coupling is to the next stage or antenna. Higher amplitude drive currents and larger phase differences between the current and voltage correspond to a greater impedance mismatch. Accordingly, the current amplitude and/or phase information from such systems can be used as a basis to determine a variation with respect to a reference matching condition.

SUMMARY OF THE INVENTION

Embodiments of the invention concern methods and systems for improving the energy efficiency of portable radio transceivers. An embodiment method involves a portable multichannel transceiver that operates in accordance with a calibration mode and an operating mode. In the calibration mode, a first calibration is performed by selectively varying one or more tuning parameters of a first antenna matching network. The parameters are varied to determine a first optimized tuning control data for the first antenna matching network with the first transmitter coupled to a first antenna through a first antenna port, and a second transmitter of the portable transceiver system inactive.

The calibration process continues by activating the second transmitter to communicate radio frequency (RF) energy to a second antenna coupled to a second antenna port of the portable transceiver system. While the second transmitter is active, a second calibration is performed for the first antenna matching network. The second calibration involves selectively varying the one or more tuning parameters of the first antenna matching network to determine a second optimized tuning control data. The first and second optimized tuning control data can then be stored in a data store and the system transitions to an operational mode. When in the operational mode, one or more tuning parameters of the first antenna matching network are controlled in accordance with the first optimized tuning control data when the second transmitter is not active, and with the second optimized tuning control data when the second transmitter is active.

The invention also concerns a portable radio transceiver system which carries out the method. The transceiver system includes first and second transmitters respectively coupled to first and second antenna ports. The transmitters provide first and second RF outputs to first and second antennas. First and second antenna matching networks are configured to facilitate impedance matching respectively between each of the first and second transmitters and the first and second antennas. A control processor has access to a data store and is configured to cause the portable transceiver system to execute a calibration mode and an operating mode as described above.

BRIEF DESCRIPTION OF THE DRAWINGS

Embodiments will be described with reference to the following drawing figures, in which like numerals represent like items throughout the figures, and in which.

DETAILED DESCRIPTION

It will be readily understood that the components of the embodiments as generally described herein and illustrated in the appended figures could be arranged and designed in a wide variety of different configurations. Thus, the following more detailed description of various embodiments, as represented in the figures, is not intended to limit the scope of the present disclosure, but is merely representative of various embodiments. While the various aspects of the embodiments are presented in drawings, the drawings are not necessarily drawn to scale unless specifically indicated.

Current and future man-pack and handheld transceiver designs face a variety of transmit scenarios where less than ideal standing wave ratios are presented via either broadband (i.e. UHF/L-band) or banded antennas (i.e. SINC-GARS). This problem is worsened as transceiver systems evolve to include multiple active transmit channels in a given form factor, as these standing wave ratios are further altered by the additional antenna radiation which varies depending on whether an adjacent channel is operating in receive or transmit mode. In a multichannel transceiver system, external antenna installations from a first transceiver module of the system can have a significant impact on a second transceiver module of the same system. This impact changes depending on whether the first transceiver module is receiving or transmitting. It also varies as a function of transmit frequency of the first transceiver module. This effect is due to a significant amount of energy being coupled between channels. The foregoing problems have a secondary effect which involves the potential to degrade realizable amplifier efficiency. Lower amplifier efficiency ultimately increases the overall radio power consumption needed to meet output power requirements. These deficiencies are addressed in a multi-channel transceiver embodiment described below in which a calibration process is implemented to compensate for the effects of adjacent RF sources upon amplifier power efficiency.

Figure 1:
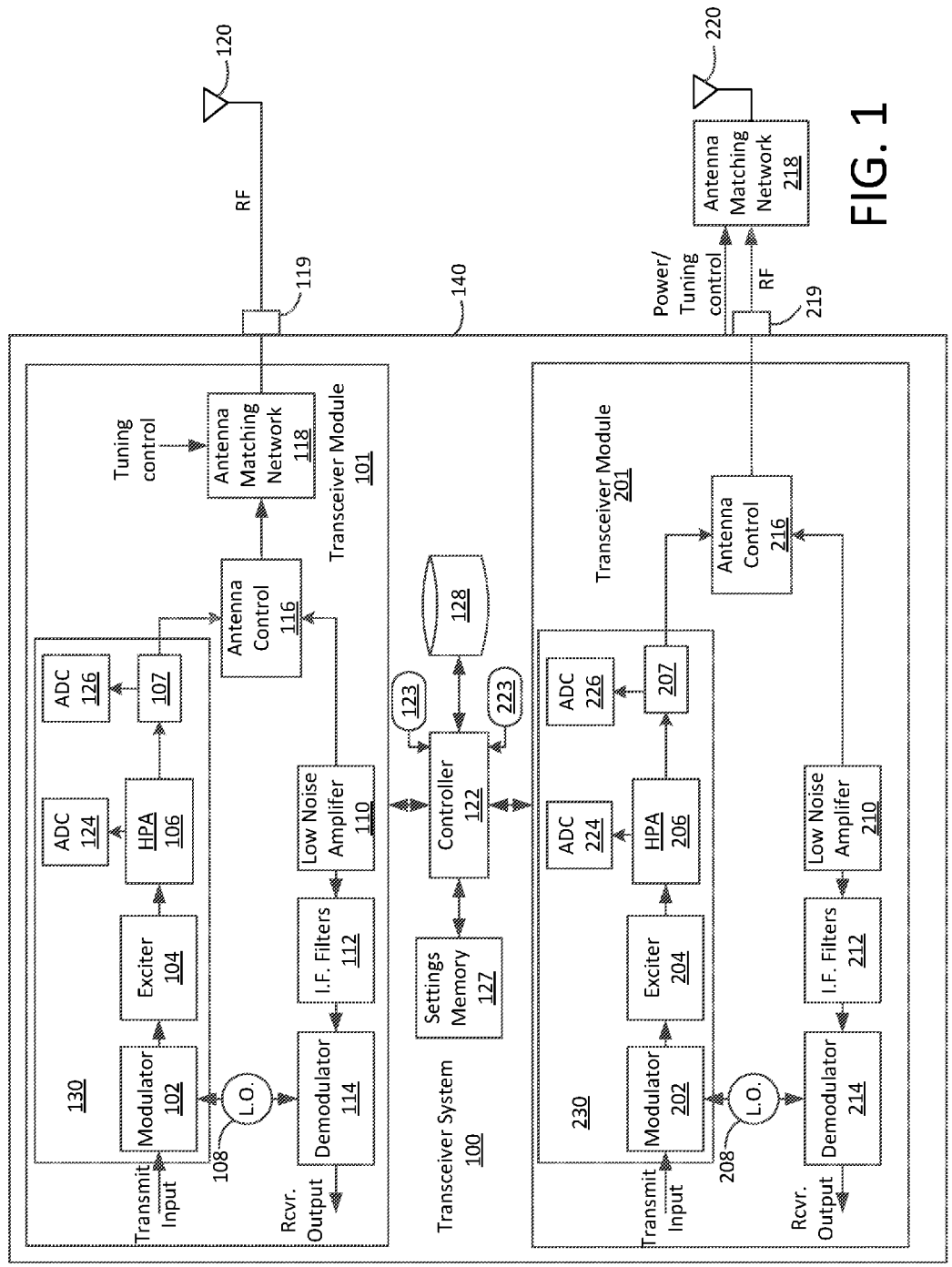
FIG. 1 is a block diagram of a portable radio transceiver system that is useful for understanding an embodiment.

Referring now to FIG. 1 there is shown a block diagram of an exemplary portable transceiver system 100. The transceiver system 100 can comprise a first transceiver module 101 disposed in a transceiver chassis 140. First transceiver module 101 can comprise various transmitter components comprising a transmitter 130. These components can include a modulator 102 configured to generate a modulated RF signal according to a selected modulation scheme and an exciter 104 which is configured to increase a power level of the modulated RF signal to a level required to drive a high powered amplifier (HPA). The transmitter components can also include an HPA 106 for receiving the output of the exciter and producing an RF signal at a power level suitable for a particular wireless transmission application.

The first transceiver module 101 can also include certain receiver components comprising a receiver section. Such receiver components can include a low noise amplifier 110 for increasing a gain level of a received signal and one or more intermediate frequency (I.F.) filters 112 for removing unwanted signals. The receiver section can also include a demodulator 114 to demodulate an RF signal which has been modulated in accordance with a predetermined modulation scheme. The modulator 102 and demodulator 114 can be configured to support a variety of different modulation schemes as may be required for different communications scenarios. Antenna control circuit 116 can comprise an antenna switch, diplexer or other suitable means to selectively control access (as between the receiver and transmitter components) to an antenna 120.

A controller 122 is provided to control the operation of one or more transmitter and/or receiver components. For example, the controller 122 can control a frequency of a local oscillator 108 and antenna control circuit 116. The controller can also selectively control a modulation scheme that is used to modulate transmitted signals and demodulate received signals in the transceiver module 101. The controller 122 can be comprised of one or more devices such as a processor, an application specific circuit, a programmable logic device, or other circuit programmed to perform the control functions described herein. As such the controller can include a digital controller, an analog controller or circuit, an integrated circuit (IC), a microcontroller, formed from discrete components, or the like.

A portable transceiver system 100 can also include at least a second transceiver module. The first and second transceiver modules can be configured to operate concurrently on different frequencies using the same or different modulation schemes so as to facilitate concurrent transceiver operations. Second transceiver module 201 can comprise a transmitter 230 which includes transmitter components such as modulator 202, exciter 204, and HPA 206. The second transceiver module 101 can also include receiver components such as a low noise amplifier 210, one or more I.F. filters 212 and demodulator 214. The modulator 202 and demodulator 214 can be configured to support a variety of different modulation schemes as may be required for different communications scenarios. Antenna control circuit 216 can comprise an antenna switch, a diplexer or other suitable means to selectively control access to an antenna 220. Controller 122 controls the operation of one or more transmitter and/or receiver components of second transceiver module 201. For example, the controller 122 can control a frequency of a local oscillator 208 and antenna control circuit 216.

Each of the first and second transceiver modules can be a wide-band transceiver system that is capable of transmitting and receiving over a wide range of RF frequencies ranging from the low HF frequency range to the UHF frequency range. Accordingly, to facilitate impedance matching to an antenna 120, 220, each of the first and second transceiver modules 101, 201 can comprise an antenna matching network (e.g. antenna matching networks 118, 218). The antenna matching networks can be configured to facilitate antenna matching functions as hereinafter described. An antenna matching network as described herein can be integrated inside the main transceiver chassis 140 as shown with respect to antenna matching network 118. Alternatively, the antenna matching network 218 can be connected externally to the transceiver chassis 140 (e.g. at a transceiver antenna port 119, 219). The controller 122 can control the operation of the antenna matching networks 118, 218. Electronically controlled antenna matching networks are known in the art and therefore will not be described herein in detail. However, it should be appreciated that the antenna matching networks 118, 218 will include one or more reactive elements which can be selectively varied to define an impedance matching network having one or more desired tuning parameters. The tuning parameters can be determined in accordance with tuner control signaling provided by the controller 122.

To facilitate certain tuning control functions described herein, the controller 122 can receive information signals from one or more components of the transceiver modules 101, 102. For example, the controller 122 can receive information concerning forward and reflected transmitter power provided by a sensing component 107, 207. In some embodiments, the sensing component can be an RF coupler which samples the high power RF signal communicated from the HPA 106, 206 to the antenna control circuit 116, 216. A magnitude of the forward and reflected transmitter power can be detected and converted to digital form by an analog-to-digital converter (ADC) 126, 226. A digital data output of the ADC 126, 226 can then be communicated to the controller 122. The controller 122 can also receive information derived from the exciter 104, 204 and/or the HPA 106, 206 pertaining to an RF amplifier load current. Suitable sensing elements can be provided in the exciter 104, 204 and/or the HPA 106, 206 to facilitate such sensing. For example, ADC 124, 224 can be provided to sense an analog current or voltage which is indicative of an RF amplifier load current. Similarly, thermal sensors 123, 223 can be provided to facilitate acquisition of a current temperature condition associated with exciters 104, 204 and/or HPAs 106, 206.

Figure 2:
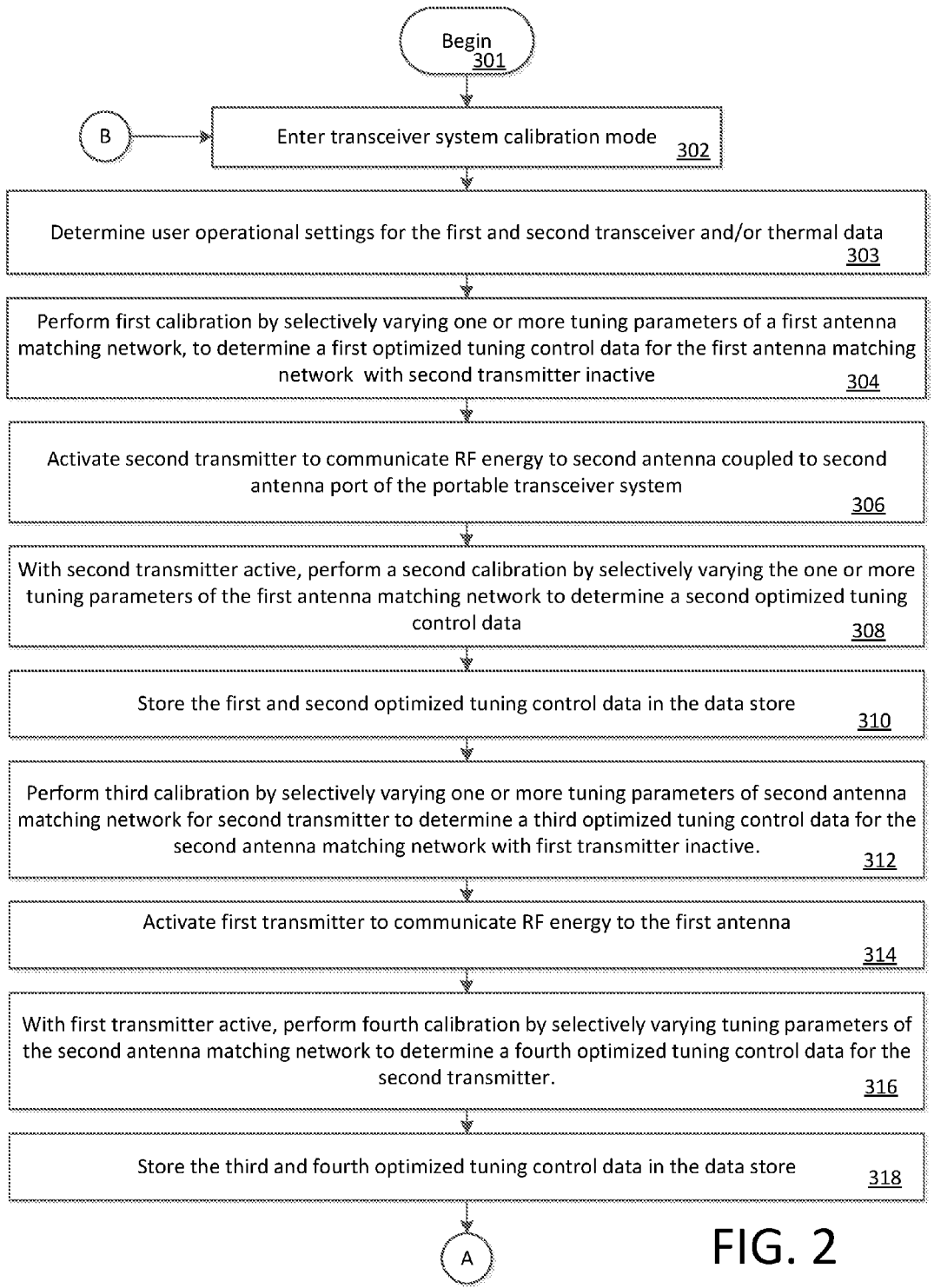
FIG. 2 is a calibration part of a flow chart that is useful for understanding an embodiment process for improving power efficiency of a portable radio transceiver system.
Figure 3:
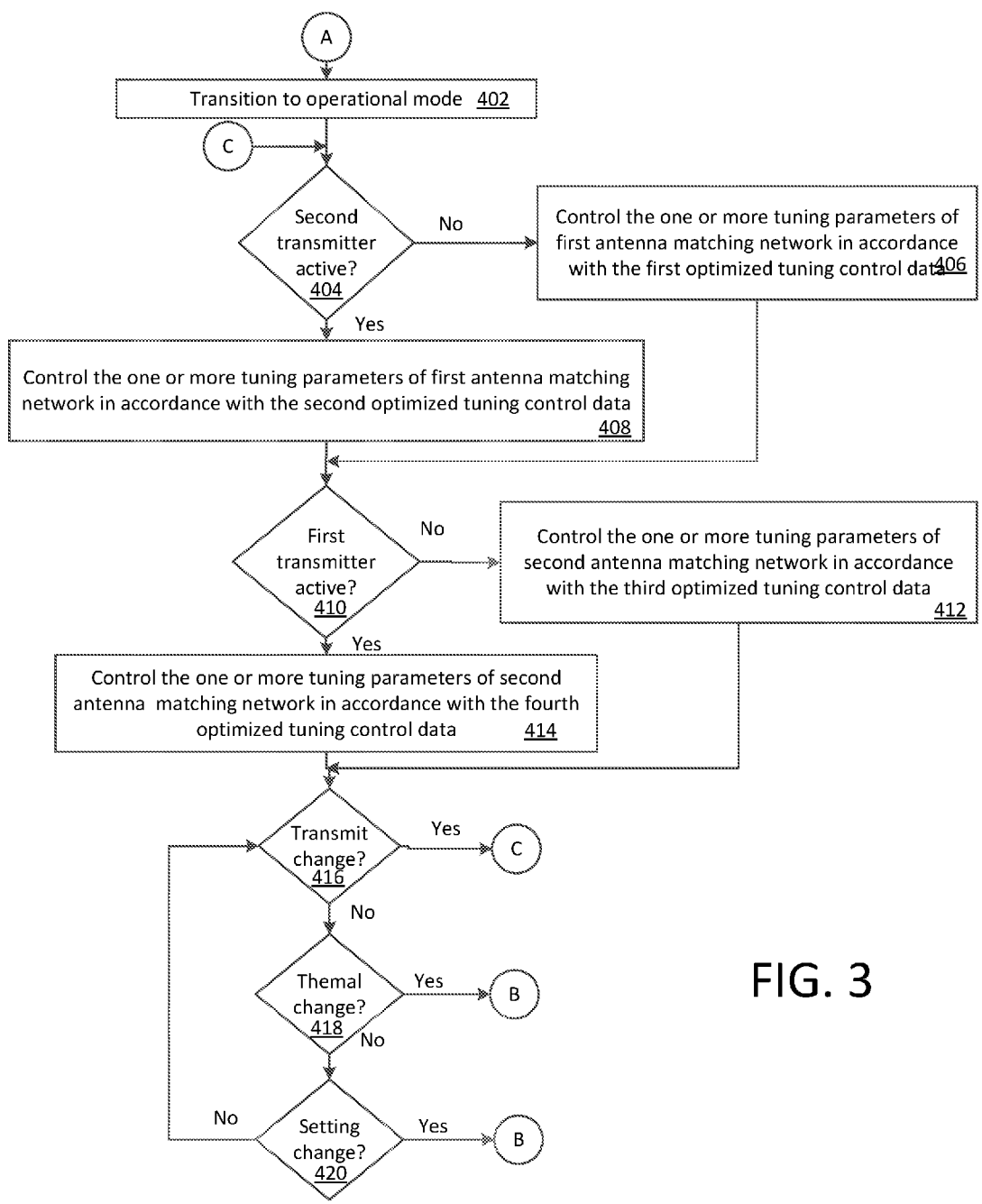
FIG. 3 is an operational part of a flow chart that is useful for understanding an embodiment process for improving power efficiency of a portable radio transceiver system.

Although a battery is not shown in FIG. 1, it will be appreciated that a transceiver system 100 as described herein can be powered by a battery. In one embodiment, the transceiver system 100 implements a method for maximizing efficiency so as to maximize a transceiver operating duration between battery charge cycles. This method will now be described herein with respect to FIGS. 2 and 3.

The method begins in step 301 and continues to step 302 in which the transceiver system 100 enters a calibration mode. Entering the calibration mode can involve temporarily suspending certain normal transceiver operations to allow the calibration operations described below to proceed under a controlled set of conditions.

The calibration process continues in step 303 in which the control processor (e.g. controller 122) can determine a set of current user operations settings for the first and second transceiver modules 101, 201. These user operational settings can include settings specifying one or more of a frequency, a waveform, and a power level selected by a user for operations involving each of the first and second transceiver module 101, 201. The operational settings can also specify whether a spread spectrum communication method has been selected for the first and/or second transceiver module and a range of frequencies which may be involved is such communications. In some embodiments, the user operational settings can further include information specifying a type of antenna connected to each of the first and second antenna ports 119, 219 and/or an antenna mounting configuration. The user operational settings described herein can be stored in a suitable memory location such as settings memory 127. In some scenarios, step 303 can also include the collection of thermal data pertaining to the first and second transmitters 130, 230. For example, this step can involve using thermal sensors 123, 223 to acquire a current temperature value associated with exciters 104, 204 and/or HPAs 106, 206. The thermal sensor data can also be stored in memory.

The process continues at 304 where the control processor performs actions to facilitate a first calibration. For example, the controller 122 can cause one or more tuning parameters of a first antenna matching network 118 to be selectively varied while short transmit pulses are communicated to the antenna from the transmitter 130. The tuning parameters are varied or swept over a predetermined range of possible values to determine a first optimized tuning control data to be used by the first antenna matching network 118. According to one aspect, the process can involve adjusting the tuning parameters to obtain minimum RF amplifier load current in transmitter 130 relative to a predetermined output transmit RF power level to determine the most power efficient impedance match. In some scenarios, the process can also involve measurements of forward and reflected RF power so as to minimize reflected RF power as seen by the first transmitter 130. Both techniques can be used when determining optimized tuning control data as described herein. However, since power conservation is a primary consideration in a portable transceiver, an implementing algorithm used for this purpose will more heavily weight the significance of amplifier load current when selecting optimal tuning values. The data concerning optimal tuning parameters is determined in this way for a single frequency or range of frequencies depending on the user operational settings. Accordingly, the first optimized tuning control data can comprise a data set or table specifying control data which will cause the first antenna matching network 118 to provide optimal impedance matching under the current operating conditions at the specified frequency or range of frequencies. In the case where the current operating conditions specify a range of frequencies, the first optimized tuning control data determined during the calibration process can comprise a plurality of data sets. In such a scenario, each data set may correspond to one frequency of a plurality of frequencies within the range of frequencies specified.

The first optimized tuning control data is determined under conditions wherein the first transmitter 130 is coupled to first antenna 120 through a first antenna port 119, and a second transmitter 230 of the portable transceiver system 100 is inactive. Although the second transmitter 230 is inactive, the second antenna 220 can be connected to second antenna port 219 which is associated with the second transmitter to facilitate the first calibration as described herein.

In a portable radio transceiver system such as a man-pack or a handheld design a first antenna 120 can be physically located less than 1 wavelength from a second antenna 220. Consequently, a VSWR experienced at the output of first transmitter 130 can change when the closely located second antenna 220 is excited by the second transmitter 230 in transmit mode. Accordingly, a purpose of the second calibration can be to obtain optimized tuning control data to be used by the first antenna tuner 118 when the second transmitter 230 is active. So after the first calibration is completed at 304, the process continues at 306 with the control processor (e.g. controller 122) activating the second transmitter 230 to communicate radio frequency (RF) energy to the second antenna 220. The transmitted RF energy is preferably selected in accordance with the current user operations settings for the second transceiver module 201. Consequently, the transmitted RF energy can replicate the effect such RF transmissions will have upon a VSWR observed at transmitter 130 during operational periods when the second transmitter 230 is transmitting.

The second calibration at 308 is similar to the first calibration insofar as it involves selectively varying one or more tuning parameters of the first antenna matching network 118 to determine second optimized tuning control data. The tuning parameters are varied or swept over a predetermined range of possible values to determine the second optimized tuning control data for the first antenna matching network 118 while second transmitter 230 is transmitting. This data is collected for transmit operations involving the first transmitter on a single frequency or range of frequencies. The single frequency or range of frequencies over which the data is collected can be indicated by the user operational settings.

The second calibration can involve collecting the second optimized tuning control data specified herein while second transmitter 230 transmits at a single frequency in accordance with the current user operational settings. However, in scenarios where the user operational settings indicate that the second transmitter 230 will be transmitting over a range of frequencies, the second optimized tuning control data can comprise a plurality of data sets. Each data set can be collected with the second transmitter operating or transmitting at one of a plurality of different frequencies within the range of frequencies indicated by the user operational settings.

Figure 4:
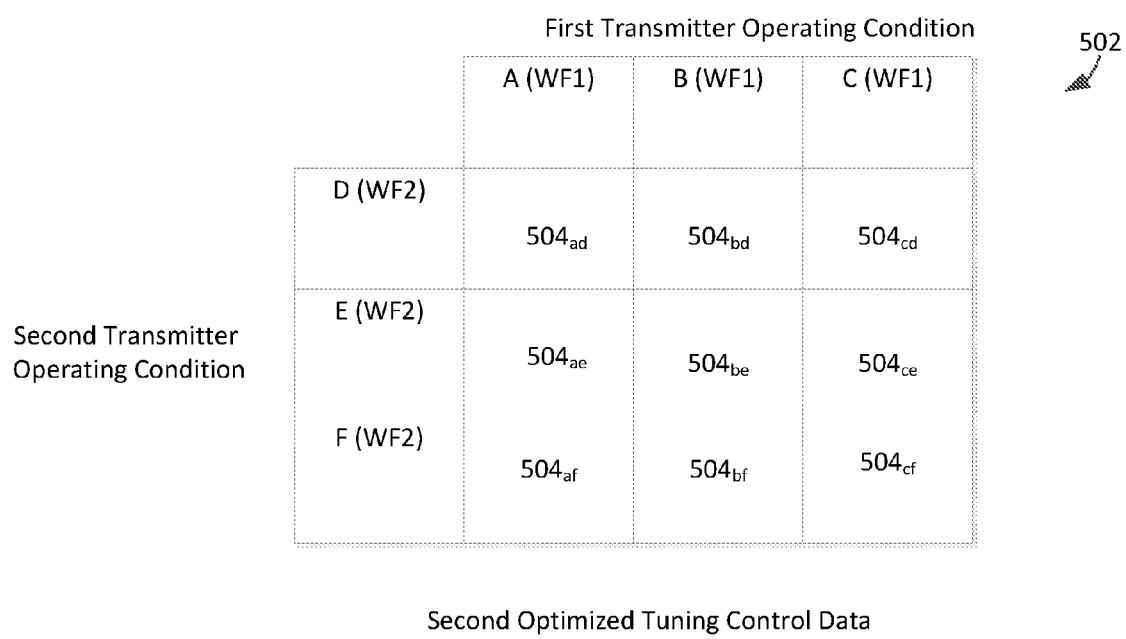
FIG. 4 is a drawing that is useful for understanding a plurality of data sets that may be acquired during a calibration mode.

The foregoing concept can be understood with reference to FIG. 4, which illustrates an exemplary scenario in which user operational settings indicate that first transmitter 130 may operate using waveform 1 (WF1) on any of frequencies A, B or C defining a frequency range. If user operational settings indicate that the second transmitter 230 will only operate on frequency D, using waveform 2 (WF2), then the optimized tuning control data may only comprise a plurality of data sets $504_{ad}$, $504_{bd}$, and $504_{cd}$. Each data set comprises optimized tuning control data acquired during calibration and corresponding to the specified combination of operating conditions associated with each of first and second transmitter. For example, data set $504_{ad}$ would correspond to optimized tuning data acquired when a first transmitter 130 transmits at user specified operating frequency A, using WF1, and second transmitter 230 transmits at user specified operating frequency D, using WF2.

But if second transmitter 230 may operate using waveform 2 (WF2) on any of frequencies D, E and F, then the second optimized tuning control data 502 can comprise a plurality of data sets $504_{ad}$, $504_{af}$, $504_{af}$, $504_{bd}$, $504_{be}$, $504_{bf}$, $504_{cd}$, $504_{ce}$, $504_{cf}$. In such a scenario, exemplary data set $504_{be}$ would correspond to optimized tuning data acquired when a first transmitter 130 transmits at user specified operating frequency B, using WF1, and second transmitter 230 transmits at user specified operating frequency E, using WF2. Similarly, exemplary data set $504_{cf}$ would correspond to optimized tuning data acquired when a first transmitter 130 transmits at user specified operating frequency C, using WF1, and second transmitter 230 transmits at user specified operating frequency F, using WF2.

After the first and second optimized tuning control data have been collected, the data can be stored at step 310 in a data storage device such as data store 128. In some scenarios, the calibration process can terminate at this point. However, it can be advantageous to also perform third and fourth calibrations as hereinafter described with respect to steps 312-316. The third and fourth calibrations are intended to provide optimized tuning control data for the second antenna matching network 218 in a manner that is similar to that described herein with respect to the first antenna matching network 118.

Accordingly at 312, the control processor (e.g. controller 122) can perform a third calibration which involves selectively varying one or more tuning parameters of the second antenna matching network 218. The third calibration involves determining a third optimized tuning control data for the second antenna matching network 218 with first transmitter 130 inactive. Thereafter, the first transmitter 130 is transitioned to an active state in which it communicates RF energy to the first antenna 120 in accordance with the user operational data. With the first transmitter active, the fourth calibration is performed by selectively varying tuning parameters of the second antenna matching network 216 to determine a fourth optimized tuning control data. A VSWR experienced by the second transmitter 230 will change when the closely located first antenna 120 is excited by the first transmitter 130 in transmit mode. Accordingly, the fourth calibration involves selectively varying one or more tuning parameters of the second antenna matching network 218 to determine fourth optimized tuning control data to be used when the first transmitter 130 in active transmit mode.

Similar to the first and second calibrations, the tuning parameters in the third and fourth calibrations can be varied or swept over a predetermined range of possible values to determine the optimized tuning control data. Also, the third and fourth optimized tuning control data can comprise optimized tuning data collected at a single frequency of the second transmitter or at selected frequency increments over a range of frequencies. If the user settings indicate that first and second transmitters 130, 230 will both actively communicate over a plurality of different frequencies, then the optimized tuning control data can be collected at one or more of such frequencies in a manner similar to that described in relation to FIG. 4. Once all the data is collected as described herein, the calibration process can finish by storing the third and fourth optimized tuning control data in a memory location (e.g. in the data store 128).

At 402 the transceiver system 100 transitions from the calibration mode to an operational mode in which user transmit and receive operations are resumed in accordance with the user operational settings. When in the operational mode the first and second transceiver module can transmit asynchronously. Accordingly, the two transceivers may or may not be transmitting at the same time. Accordingly, the process continues at 404 where a determination is made as to whether the second transmitter is active. If not (404: No) then the process continues to 406 where the one or more tuning parameters of the first antenna matching network are controlled in accordance with the first optimized tuning control data. Use of the first optimized tuning control data to control the antenna matching network 118 will cause the antenna matching network to provide the transmitter 130 with an impedance match that facilitates an optimally low transmitter RF amplifier load current. But if the second transmitter is active (404: Yes) then the process continues to step 408 where the one or more tuning parameters are controlled in accordance with the second optimized tuning control data.

The process continues to step 410 where a determination is made as to whether the first transmitter is active. If not (410: No) then the process continues to step 412 where the one or more tuning parameters of the second antenna matching network are controlled in accordance with the third optimized tuning control data. But if the first transmitter is active (410: Yes) then the process continues to step 414 where the one or more tuning parameters are controlled in accordance with the fourth optimized tuning control data.

As noted above, the first optimized tuning parameters can be determined over a range of different frequencies when dictated by a user operational setting for the transceiver system. Similarly, the second optimized tuning parameters can comprise a plurality of data sets determined over a range of different frequencies over which the first transmitter is expected to operate in accordance with a user operational setting for the first transceiver module. Alternatively, as shown in FIG. 4, the second optimized tuning parameters can include a plurality of data sets obtained for a plurality of different transmitter frequencies over which the first and second transmitter is expected to operate. The need for such additional data sets will be determined by the user operational settings associated with the first and second transmitter.

Consequently, in steps 406 and 408, a data set selected from the first or second optimized tuning parameters will depend upon the current real-time operating characteristics of the first and second transmitter. As an example, assume that in step 406 the first transmitter is transmitting in operating mode at a frequency "A" and the second transmitter is inactive. In that case, the control processor will select from the first optimized tuning parameters a particular data set obtained during calibration with the first transmitter transmitting exactly or approximately to first transmitter frequency "A" (and with the second transmitter inactive).

As a second example, assume that in step 408, with the second transmitter active, that the first transmitter is transmitting in operating mode at frequency A as indicated in FIG. 4. Assume further that the second transmitter is actively transmitting at frequency "E". In such a scenario, the control processor will select from the second optimized tuning parameters a particular data set $504_{ae}$ obtained during calibration with the first transmitter transmitting exactly or approximately at first transmitter frequency "A" and with the second transmitter transmitting exactly or approximately at frequency E. A similar selection of third and fourth optimized tuning control data may be performed respectively in steps 412 and 414.

At step 416 a determination is made as to whether a transmit condition has changed. A transmit condition evaluated at 416 can comprise any variation in a transmit condition of the first or second transmitter 130, 230. For example, with reference to FIG. 4, a transmitter change can occur when the first transmitter transitions from using transmitter frequency A to transmitter frequency B. Likewise, a transmitter change can occur when the second transmitter transition from transmitter frequency D to transmitter frequency E. A transmit condition change can also involve a period during which it is determined that the first or second transmitter has transitioned to a state in which it is no longer transmitting. If a transmitter condition change is detected (416: Yes) then the process returns to step 404. At 404 one or more new data set(s) of optimized tuning parameters can be selected from among the previously determined first, second, third and/or fourth optimized tuning control data.

If no transmitter change is detected (416: No) then the process can continue to step 418 where a determination is made as to whether a thermal change has occurred. Such thermal change could involve a determination that a current temperature of an RF amplifier differs by a predetermined amount relative to a temperature of the RF amplifier at an earlier time when the first, second, third and/or fourth optimized tuning data was last acquired. A thermal change can cause an operating characteristic (output impedance) of a transmitter to vary in a manner such that the optimized tuning parameters are no longer optimal. If a change in thermal conditions exceeds a predetermined thermal variation threshold (418: Yes), the process can return to the calibration mode at step 302 where new optimized tuning data can be acquired.

As an alternative, in some scenarios, it can be advantageous to acquire data sets for the first, second, third and fourth optimized tuning data at a plurality of different RF amplifier thermal conditions. For example, such data sets can be collected during the calibration phase. If different data sets are collected in this manner, then a thermal change detected at step 418 could result in the process returning to step 404, where a new data set of optimized tuning parameters can be selected from among the previously determined data sets.

If thermal conditions have not changed or varied beyond some threshold (418: No), the process can continue to step 420 where a determination is made as to whether a change has occurred with respect to the user operational settings. A user operational setting change in detected at 420 can include a user selection of a new frequency, power level, or waveform to be used by the first or second transmitter. Other changes in user operational setting change can include a change in an antenna type, or antenna configuration. If a user operational setting change has occurred (420: Yes) then the system can return to the calibration mode at step 302 where new optimized tuning data can be acquired. If user operational settings have not changed (420: No), the system can return to step 416 to continue monitoring for other changes in system status.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

We claim:

1. A method for maximizing efficiency in a portable transceiver system, comprising:
   during a calibration mode,
      performing a first calibration by selectively varying one or more tuning parameters of a first antenna matching network, to determine a first optimized tuning control data for a first antenna matching network with the first transmitter coupled to a first antenna through a first antenna port, and a second transmitter of the portable transceiver system inactive;
      activating the second transmitter to communicate radio frequency (RF) energy to a second antenna coupled to a second antenna port of the portable transceiver system;
      while the second transmitter is active, performing a second calibration of the first antenna matching network by selectively varying the one or more tuning parameters of the first antenna matching network to determine a second optimized tuning control data;
      storing the first and second optimized tuning control data in a data store; and
   during an operational mode,
      controlling the one or more tuning parameters in accordance with the first optimized tuning control data when the second transmitter is not active, and with the second optimized tuning control data when the second transmitter is active.

2. The method according to claim 1, wherein the calibration mode is repeated when a change is detected in at least one transmitter operating condition associated with at least one of the first and second transmitter.

3. The method according to claim 2, wherein the at least one transmitter operating condition is selected from the group consisting of a transmit frequency, a transmitted waveform type, a transmit power level, and an RF power amplifier temperature.

4. The method according to claim 1, wherein the first antenna matching network is coupled to the portable transceiver system at the output of the first antenna port, external of a main chassis of the portable transceiver system.

5. The method according to claim 4, wherein the first antenna matching network receives primary power through a DC voltage supply line integrated with the first antenna port, and further comprising controlling the one or more tuning parameters by modulating the DC voltage in accordance with a tuner control signal.

6. The method according to claim 1, wherein the first calibration comprises monitoring an amplifier load current of at least one RF power amplifier associated with the first transmitter concurrent with the varying of the one or more tuning parameters to determine the first optimized tuning control data.

7. The method according to claim 6, wherein the first optimized tuning control data includes at least one tuning parameter value that causes the amplifier load current to be minimized for a given transmit output power level.

8. The method according to claim 1, wherein the first calibration is performed over a range of transmit frequencies of the first transmitter to determine the first optimized tuning control data.

9. The method according to claim 1, wherein the second calibration is performed over a range of transmit frequencies of the second transmitter to determine the second optimized tuning control data.

10. The method according to claim 1, further comprising performing a third calibration of the portable transceiver system by selectively varying one or more tuning parameters of a second antenna matching network for the second transmitter to determine a third optimized tuning control data for the second antenna matching network obtained with the first transmitter of the portable transceiver system inactive.

11. The method according to claim 10, further comprising:
activating the first transmitter to communicate radio frequency (RF) energy to the first antenna;
while the first transmitter is active, performing a fourth calibration of the second antenna matching network by selectively varying the one or more tuning parameters of the second antenna matching network to determine a fourth optimized tuning control data for the second transmitter; and
storing the third and fourth optimized tuning control data in the data store.

12. The method according to claim 11, further comprising:
during the operational mode, controlling the one or more tuning parameters applied to the second antenna matching network in accordance with the third optimized tuning control data when the first transmitter is not active; and
controlling the one or more tuning parameters in accordance with the fourth optimized tuning control data when the first transmitter is active.

13. A portable radio transceiver system, comprising:
first and second transmitters respectively coupled to first and second antenna ports for providing first and second RF outputs to first and second antennas;
first and second antenna matching networks configured to facilitate impedance matching respectively between each of the first and second transmitters and the first and second antennas;
a control processor having access to a data store and configured to cause the portable transceiver system to execute a calibration mode and an operating mode, wherein
the calibration mode comprises:
performing a first calibration by selectively varying one or more tuning parameters of the first antenna matching network, to determine a first optimized tuning control data with the second transmitter inactive;
activating the second transmitter to communicate radio frequency (RF) energy to the second antenna;
while the second transmitter is active, performing a second calibration of the first antenna matching network by selectively varying the one or more tuning parameters to determine a second optimized tuning control data;
storing the first and second optimized tuning control data in a data store; and
wherein the operational mode comprises,
controlling the one or more tuning parameters of the first antenna matching network in accordance with the first optimized tuning control data when the second transmitter is not active, and in accordance with the second optimized tuning control data when the second transmitter is active.

14. The portable radio transceiver system according to claim 13, wherein the control processor is configured to cause the calibration mode to be repeated when a change is detected in at least one transmitter operating condition associated with at least one of the first and second transmitter.

15. The portable radio transceiver system according to claim 14, wherein the at least one transmitter operating condition is selected from the group consisting of a transmit frequency, a transmitted waveform type, a transmit power level, and an RF power amplifier temperature.

16. The portable radio transceiver system according to claim 13, wherein the first and second transmitters are disposed within a main chassis of the portable radio transceiver system, and the first antenna matching network is coupled to the portable transceiver system at the output of the first antenna port, external of a main chassis.

17. The portable radio transceiver system according to claim 16, further comprising a DC voltage supply line integrated with the first antenna port which supplies primary power to the first antenna matching network, and wherein the control processor is configured to control the one or more tuning parameters by modulating the DC voltage with a tuner control signal.

18. The portable radio transceiver system according to claim 13, wherein the control processor is configured during the calibration mode to monitor an amplifier load current of at least one RF power amplifier of the first transmitter concurrent with the varying of the one or more tuning parameters to determine the first optimized tuning control data.

19. The portable radio transceiver system according to claim 18, wherein the control processor is configured to select the first optimized tuning control data to include at least one tuning parameter value that causes the amplifier load current to be minimized for a given transmit output power level.

20. The portable radio transceiver system according to claim 13, wherein the control processor is configured to cause the first calibration to be performed over a range of transmit frequencies of the first transmitter to determine the first optimized tuning control data.

21. The portable radio transceiver system according to claim 13, wherein the control processor is configured to cause the second calibration to be performed over a range of transmit frequencies of the second transmitter to determine the second optimized tuning control data.

* * * * *